United States Patent
Wincek et al.

(10) Patent No.: US 10,713,000 B2
(45) Date of Patent: Jul. 14, 2020

(54) OVERRIDE FOR OEM AUDIO SIGNAL EQUALIZER

(71) Applicant: AAMP of Florida, Inc., Clearwater, FL (US)

(72) Inventors: Nathaniel Lee Wincek, New Port Richey, FL (US); Michael Lake, Seminole, FL (US)

(73) Assignee: AAMP of Florida, Inc., Clearwater, FL (US)

( * ) Notice: Subject to any disclaimer, the term of this patent is extended or adjusted under 35 U.S.C. 154(b) by 18 days.

(21) Appl. No.: 15/967,696

(22) Filed: May 1, 2018

(65) Prior Publication Data

US 2018/0321899 A1 Nov. 8, 2018

Related U.S. Application Data (60) Provisional application No. 62/500,045, filed on May 2, 2017.

(51) Int. Cl.
*G06F 3/16* (2006.01)
*G10K 11/175* (2006.01)
*H03G 5/16* (2006.01)
*H03G 5/00* (2006.01)

(52) U.S. Cl.
CPC ............ *G06F 3/165* (2013.01); *G10K 11/175* (2013.01); *H03G 5/005* (2013.01); *H03G 5/165* (2013.01)

(58) Field of Classification Search
CPC ...... G06F 3/165; G10K 11/175; H03G 5/165; H03G 5/005

USPC .......................................................... 700/94
See application file for complete search history.

(56) References Cited

U.S. PATENT DOCUMENTS

| 5,677,960 | A | * | 10/1997 | Unno | H03G 3/32 |
| | | | | | 381/71.1 |
| 7,215,784 | B1 | * | 5/2007 | Pham | H03G 5/00 |
| | | | | | 381/103 |
| 9,736,588 | B2 | * | 8/2017 | Rutledge | G06F 3/165 |
| 2005/0213776 | A1 | * | 9/2005 | Honji | H03G 3/32 |
| | | | | | 381/86 |
| 2006/0034471 | A1 | * | 2/2006 | Bongiovi | H03G 9/005 |
| | | | | | 381/103 |
| 2012/0163621 | A1 | * | 6/2012 | Riggs | H03G 3/3005 |
| | | | | | 381/86 |
| 2013/0197753 | A1 | * | 8/2013 | Daly | H04B 1/082 |
| | | | | | 701/36 |

(Continued)

*Primary Examiner* — Hemant S Patel
(74) *Attorney, Agent, or Firm* — Michael Best & Friedrich LLP (57) ABSTRACT

Apparatus and methods for processing an audio signal. The apparatus may include a digital signal processor ("DSP") configured to receive an audio signal from a vehicular audio signal line. The audio signal may include a flat component and a compensatory component. The flat component may correspond to the audio signal in a state before combination with the compensatory component. The compensatory component may include an OEM EQ component. The apparatus may include a microprocessor in electronic communication with the DSP. The microprocessor may be configured to retrieve from the memory a restorative signal component. The microprocessor may be configured to instruct the DSP to apply the restorative signal component to the audio signal to reduce the audio signal to the flat component.

25 Claims, 8 Drawing Sheets

(56) References Cited

U.S. PATENT DOCUMENTS

2013/0315409 A1* 11/2013 Inoue ............... G10K 11/17833
381/71.1

* cited by examiner

| Play Volume | Coefficients for frequency-weighting function | | | | |
|---|---|---|---|---|---|
| $v_1$ | $a_1$ | $b_1$ | $c_1$ | $d_1$ | $e_1$ |
| $v_2$ | $a_2$ | $b_2$ | $c_2$ | $d_2$ | $e_2$ |
| $v_3$ | $a_3$ | $b_3$ | $c_3$ | $d_3$ | $e_3$ |
| $v_4$ | $a_4$ | $b_4$ | $c_4$ | $d_4$ | $e_4$ |
| $v_5$ | $a_5$ | $b_5$ | $c_5$ | $d_5$ | $e_5$ |

OVERRIDE FOR OEM AUDIO SIGNAL EQUALIZER

CROSS-REFERENCE TO RELATED APPLICATIONS

This application is a nonprovisional of U.S. Provisional Application No. 62/500,045, filed on May 2, 2017, which is hereby incorporated herein in its entirety.

BACKGROUND

Original equipment manufacturers ("OEMs") of automobile sound systems typically include sound equalization ("EQ") in a radio head unit that is installed in a new automobile. The radio head unit is typically logically situated between an audio source and an audio system that may include an amplifier and speakers.

The equalization is typically designed to improve a listener's audio experience inside the car, usually when OEM audio equipment, such as a speaker, is in use, but often causes degraded sound quality when the OEM audio equipment is replaced by aftermarket audio equipment.

Original equipment manufacturers may provide a transfer function to a microprocessor that is logically situated between the digital audio source and the transducers or speakers. The transfer function may "improve" the acoustic signal, for example, to compensate for shortcomings in OEM audio equipment, by operating on a digital audio data packet to digitally enhance the acoustic signal in the cabin. The transfer function may act by applying weights to different frequencies in the acoustic spectrum.

If a component of the vehicle's sound system, or a component of the vehicle itself, is changed after installation of the transfer function, the weights may no longer improve the listener experience.

BRIEF DESCRIPTION OF DRAWINGS

The objects and advantages of the invention will be apparent upon consideration of the following detailed description, taken in conjunction with the accompanying drawings, in which like reference characters refer to like parts throughout, and in which.

DESCRIPTION

Apparatus and methods for processing an audio signal are provided. Some or all of the methods may involve some or all of the apparatus. The apparatus may include a digital signal processor ("DSP") configured to receive an audio signal from a vehicular audio signal line. The audio signal may include a flat component and a compensatory component. The flat component may correspond to the audio signal in a state before the audio signal was combined with the compensatory component. The compensatory component may include an OEM EQ component. The OEM EQ component may include phase shift relative to the audio signal for the different frequencies. The apparatus may include a microprocessor in electronic communication with the DSP. The apparatus may include machine-readable memory in electronic communication with the microprocessor.

The microprocessor may be configured to retrieve from the memory a restorative signal component. The microprocessor may be configured to instruct the DSP to apply the restorative signal component to the audio signal to reduce the audio signal to the flat component.

The restorative signal component may include a restorative function. The restorative component may be referred to herein as an OEM EQ override signal. The restorative component may include weightings for the different frequencies to nullify the weightings of the compensatory component. The restorative component may include phase shifts for the different frequencies to nullify phase shifts of the compensatory component.

The restorative function may correspond to one or more vehicle state values. The restorative function may correspond to one or more vehicle configuration parameters. The restorative function may correspond to one or more vehicle state values and one or more vehicle configurations at the same time.

The apparatus may include an OEM-EQ-Override circuit. The circuit may nullify the OEM-EQ or perform one or more of the other methods described herein.

The override circuit may provide equalizer weightings that enhance the audio experience based on the installation of aftermarket equipment. The override circuit may provide equalizer weightings that enhance the audio experience based on vehicle data. The override circuit may provide equalizer weightings that enhance the audio experience based on driver or passenger preferences. The override circuit may provide equalizer weightings that enhance the audio experience based on real-time analysis of acoustic signals in a vehicle cabin.

The apparatus and methods may involve wirelessly or via wire receiving output from the OEM transfer function and applying an override transfer function that corresponds to different weights, phase shifts, or both.

Output from the override transfer function may be spectrally flat when the override circuit removes the compensatory signal. Output from the override function may be curved to adjust the acoustic signal differently at different frequencies when the override circuit adds an equalization signal.

The override transfer function may result in different weights, phase shifts, or both, for different frequencies.

The dependence of weight on frequency may be represented as a function such as shown in Equation 1.

$$W = W(\phi) \qquad \text{Eq'n. 1,}$$

in which $\phi$ may be a vector that includes frequency (f) and one or more equalization parameters such as those shown in Tables 1-3. Parameters may be sensed in real time. Parameters may be included in a profile. Parameters may be user-selected.

Parameters may be stored and retrieved based on data from a vehicle data bus. Parameters may be stored and retrieved based on signals from a steering wheel control. Parameters may be stored and retrieved based on data from a head unit user interface. The parameters may include one or more vehicle state values and vehicle configuration parameters.

User selected volume setting is a setting that may be "read" from a user-adjustable volume control. The volume control may have a plurality of settings. The settings may be selected by a user. The volume control may be an OEM volume control. The volume control may be part of the OEM head unit. The volume control may be a volume control that is not an aftermarket volume control. The volume control may be a volume control that is an aftermarket volume control.

The setting may be read from a vehicle data bus. The setting may have discrete values. The discrete values may correspond to "clicks" on a user-adjustable knob. The discrete values may correspond to bars, numerical level or other discretely valued indications.

The OEM-EQ weighting may be mapped for each volume setting so that it can be "flattened" across frequencies at each of the volume settings.

DSP data arrays are now described for weightings. Analogous arrays may be used for phase shifts.

If frequency is a discrete band of frequencies, W may be a vector quantity $W_i$. $W_i$ may be represented as in Equation 2.

$$W_i = W_i(\phi_i) \quad \text{Eq'n. 2}$$

where i corresponds to a frequency band, and $\phi_i$ may depend on one or more of frequency, user selectable volume, music genre, a user-selected preference, a known aftermarket component attribute, and any other suitable audio system state variables, components or configurations, for example, any parameters such as those shown in Table 1.

For example, $\phi_I$ may be represented as shown in Eq'n 3.

$$\phi_i = \phi_i(f_i, V_p, M_q, U_r, A_s, \ldots) \quad \text{Eq'n. 3}$$

$f_i$ may be a discrete frequency band. $V_p$ may be one of p different user-selectable volume settings on a head unit. $M_q$ may be one of q different music genres. The genres may be user selectable. The genres may be readable from metadata in an audio file header, for example. $U_r$ may be one of r user-programmable values for setting the $W_i$. $A_s$ may correspond to one or more of s after-market components for which override equalization is known. $A_s$ may be stored in on-board memory. $A_s$ may be stored in an internet-accessible location. $A_s$ may be downloaded in response to a user command. The apparatus may provide to the user a menu of different aftermarket component identifiers. The user may select a component from the menu. The apparatus may then download the corresponding A.

For each i, p, q, r, and s, etc., $W_i$ may depend on a vector $C_j$ of coefficients that are selected to adjust the acoustic signal.

The apparatus and methods may involve a microprocessor. The microprocessor may be in communication with a vehicle data bus. The microprocessor may be a head unit microprocessor. The microprocessor may be a stand-alone microprocessor. The stand-alone microprocessor may be in communication with the vehicle data bus. The stand-alone microprocessor may be in communication with the vehicle audio system. The microprocessor may include a digital signal processor. The apparatus may include a digital signal processor that is different from the microprocessor. The apparatus and methods may involve machine readable memory.

The machine readable memory may store a multidimensional array. For the sake of clarity, the array will be described as having rows and columns. Each row may correspond to a different user-controllable audio volume setting. Each column may correspond to a constant in a weighting such as $W_i$. The memory thus stores a $W_i$ for each volume setting.

The restorative signal component may correspond to a vehicle state value.

The restorative function corresponds to a vehicle configuration parameter.

The microprocessor may be configured to detect a change in the vehicle state value, and instruct the DSP to apply the restorative signal component to the audio signal based on the change.

The vehicle state value may correspond to a vehicle state. Table 1 lists illustrative vehicle states.

TABLE 1

Illustrative vehicle states
Illustrative vehicle state

Audio volume control setting
Sunroof position
Sunroof interior panel position
Panoramic roof position
Hatch (e.g., trunk lid) position
Window position
Door position
Vehicle speed
Exhaust note or other engine tones or frame or body frequencies
Convertible top position(up, down)
Engine speed(RPM)
Passenger census or vehicle occupancy (e.g., driver-only profile, driver + front passenger profile, vehicle-full profile (may be automatically detected by seat sensors)

The restorative function may correspond to a vehicle configuration parameter. The vehicle configuration parameter may correspond to a vehicle configuration. Table 2 lists illustrative vehicle configurations.

TABLE 2

Illustrative vehicle configurations
Illustrative vehicle configuration

Vehicle interior material (e.g., upholstery, floor covering, interior side panel covering)
Number of vehicle doors
Engine size
Exhaust system type
Known aftermarket sound system attribute
Vehicle year
Vehicle make
Vehicle model
Any other suitable vehicle or audio system variables, components or configurations, or combinations thereof.

The memory may be configured to store the vehicle configuration parameter.

A vehicle data bus may be configured to transmit the vehicle configuration parameter.

The compensatory signal may include an original equipment manufacturer compensatory signal, such as an OE-EQ signal.

One or more of the components may be signals. One or more of the functions may be signals. One or more of the signals may be non-transitory signals.

The microprocessor may be configured to instruct the DSP to add to the audio signal an equalization component.

The equalization signal may include weightings $E_i$, $$E_i = E_i(\theta_i) \qquad \text{Eq'n. 4,}$$

wherein the $E_i$ may correspond, in an equalization context, to the $W_i$ and the $\theta_i$ may correspond, in the equalization context, to $\phi_i$. The $E_i$ may be set for each volume setting so that they may include for one or more of the volume settings different weights, phase shifts, or both, across the frequencies.

The equalization component may include a real time analysis ("RTA") feedback component. The RTA may receive input from a vehicle microphone array, e.g. The RTA component may include an active noise cancellation component.

The equalization component may include an active noise cancellation component.

Table 3 lists illustrative noise factors that may be equalized using RTA.

TABLE 3

Illustrative noise factors that may be equalized using RTA
Illustrative noise factor Road noise
Wind noise
Other noise The equalization component may include a vehicle state component.

The vehicle state component may be stored in machine readable memory in association with a vehicle state value.

The equalization component may include a vehicle configuration component.

The machine readable memory may be configured to store the vehicle configuration component in association with a vehicle configuration parameter.

The methods may include methods for providing a sound signal. The methods may include receiving an electrical audio signal having a flat component and a compensatory component. The methods may include removing the compensatory component.

The removing may include selecting from machine readable memory a restorative function corresponding to a vehicle state value on a data bus. The removing may include combining the function with the audio signal.

The combining may include adding the function to the audio signal.

The combining may include subtracting the function from the audio signal.

The vehicle state value may be a first vehicle state value. The methods may include performing the removing in response to a detection of a second vehicle state value that is different from the first vehicle state value.

The removing may include selecting from machine readable memory a restorative function corresponding to a vehicle configuration parameter. The removing may include; combining the function with the audio signal.

The selecting may include retrieving the vehicle configuration parameter from the memory.

The selecting may include receiving the vehicle configuration parameter from a vehicle data bus.

The compensatory signal may include an original equipment manufacturer compensatory signal.

The methods may include adding to the audio signal, after the removing, an equalization component.

The equalization component may include an active noise cancellation component.

The equalization component may include a vehicle state component.

The vehicle state component may be stored in machine readable memory in association with a vehicle state value.

The vehicle configuration component may be stored in machine readable memory in association with a vehicle configuration parameter.

The methods may include retrieving the equalization component from a user-selected equalization component area of machine readable memory.

The equalization component may correspond to one or more vehicle state values. The equalization component may correspond to one or more vehicle configuration parameters. The equalization component may correspond to one or more vehicle state values and one or more vehicle configurations at the same time.

The methods may include retrieving the equalization component from a music genre equalization component area of machine readable memory.

Some embodiments may omit features shown and/or described in connection with the illustrative apparatus. Some embodiments may include features that are neither shown nor described in connection with the illustrative apparatus. Features of illustrative apparatus and methods may be combined. For example, one illustrative embodiment may include features shown in connection with another illustrative embodiment.

The steps of illustrative methods may be performed in an order other than the order shown and/or described herein. Some embodiments may omit steps shown and/or described in connection with the illustrative methods. Some embodiments may include steps that are neither shown nor described in connection with the illustrative methods. Illustrative method steps may be combined. For example, one illustrative method may include steps shown in connection with another illustrative method.

Embodiments may involve some or all of the features of the illustrative apparatus and/or some or all of the steps of the illustrative methods.

Illustrative apparatus and methods will now be described with reference to the accompanying drawings in the Figures, which form a part hereof. It is to be understood that other embodiments may be utilized and that structural, functional and procedural modifications may be made without departing from the scope and spirit of the present disclosure.

Figure 1:
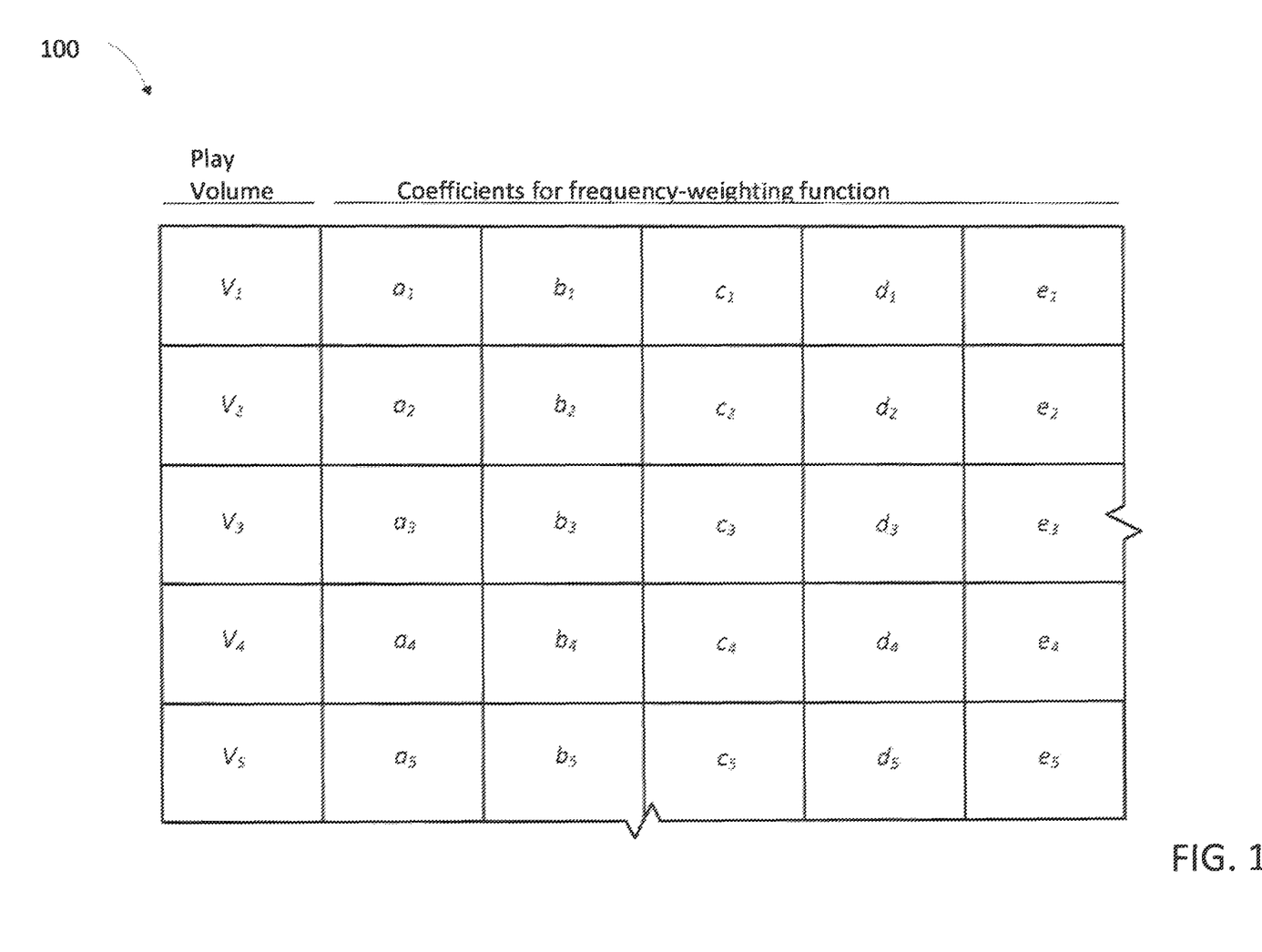
FIG. 1 shows schematically illustrative information that may be used in connection with apparatus and methods in accordance with principles of the invention.
Figure 2:
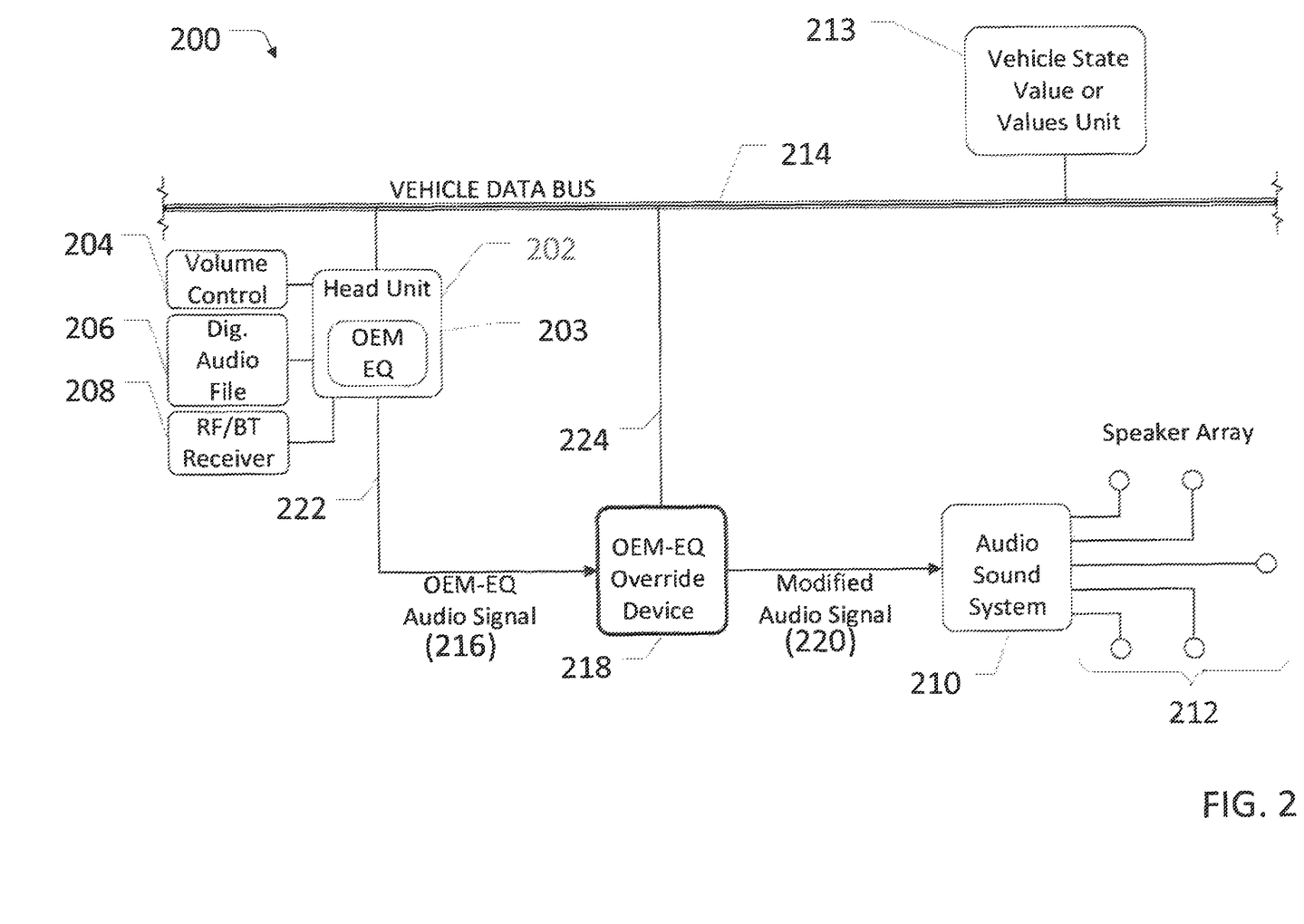
FIG. 2 shows schematically illustrative apparatus in accordance with principles of the invention.
Figure 3:
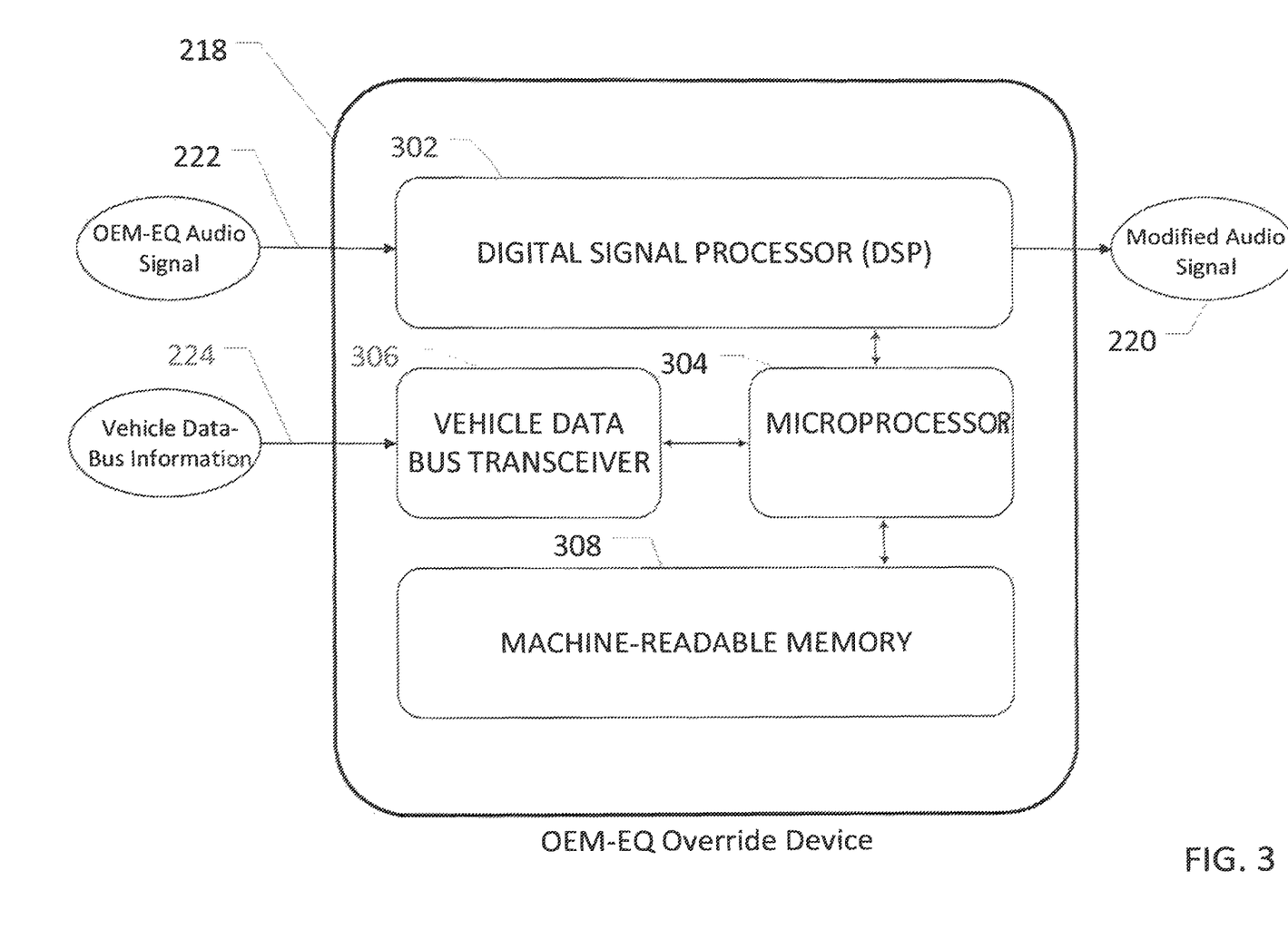
FIG. 3 shows schematically illustrative apparatus in accordance with principles of the invention.

Processes in accordance with the principles of the invention may involve or include one or more features of the information, apparatus or processes illustrated in FIGS. 1-8. For the sake of illustration, the steps of the illustrated processes will be described as being performed by a "system." The "system" may include one or more of the features of the information and apparatus that are shown in FIGS. 1-3 and/or any other suitable device or approach. The "system" may be provided by an entity. The entity may be an individual, an organization or any other suitable entity.

FIG. 1 shows schematically illustrative architecture 100 of cells in a machine-readable memory array. For each volume setting $V_i$, the system may retrieve corresponding coefficients $a_i$, $b_i$, $c_i$, $d_i$, $e_i$, . . . , etc. The coefficients may correspond to a frequency weighting function. The frequency weighting function may include a compensatory component, a restorative component, an equalization component, or any other suitable component.

FIG. 2 shows schematically illustrative architecture 200 of a vehicular network for providing acoustic signals to a vehicle passenger compartment. Head unit 202 may receive signals from one or more of volume control 204, digital audio file 206, radio frequency or blue tooth receiver 208, and any other suitable device. Head unit 202 may produce from audio file 206 a flat audio component. Head unit 202 may include OEM equalizer ("EQ") 203. OEM EQ 203 may combine a compensatory component with the flat audio component to produce OEM-EQ audio signal 216.

Some vehicles may include an OEM amplifier that is physically separate, and may be disposed in a different circuit position, from the head unit. In such vehicles, OEM EQ 203 may be implemented in the separate amplifier, instead of in the head unit.

Audio sound system 210 may be an analog sound system. Audio sound system 210 may be a digital sound system. Audio sound system 210 may be in communication with speaker array 212. Speaker array 212 may include one or more speakers in the cabin. Audio sound system 210 may be in communication with a microphone array (not shown). The microphone array may include one or more microphones in the cabin.

Vehicle state values unit 213 may provide one or more vehicle state values to vehicle data bus 214. Unit 213 may be part of head unit 202. Unit 213 may be functionally distributed in numerous devices on data bus 214. Unit 213 may be a centralized status value monitor.

Head unit 202 may transmit OEM-EQ Audio signal 216 along audio channel 222 to OEM-EQ Override device 218. In vehicles having an OEM amplifier that is separate from the head unit, device 218 may be located "downstream" from the OEM amplifier (wherever the OEM amplifier is located in the circuit).

Device 218 may perform one or more of steps of the methods described herein. Device 218 may output modified audio signal 220 to audio sound system 210. Audio sound system 210 may include an amplifier to boost audio signal 220 for performance in speaker array 212. (This amplifier is distinct from an OEM amplifier mentioned as being separate from the head unit, and operating in connection with the OEM-EQ.) Override Device 218 may be in data communication with vehicle data bus 214 via data channel 224.

FIG. 3 shows schematically illustrative OEM-EQ override device 218 (shown also in FIG. 2). Device 218 may include one or of digital signal processor ("DSP") 302, microprocessor 304, vehicle data bus transceiver 306, machine-readable memory 308 and any other suitable components. DSP 302 may receive the OEM-EQ audio signal from channel 222. DSP 302 may be in communication with microprocessor 304. Microprocessor 304 may provide instructions to DSP 302 to combine one or more signals to produce modified or optimized audio signal 220 for audio sound system 210 (shown in FIG. 2). Microprocessor 304 may retrieve one or more signals or components from machine-readable memory 308. Microprocessor 304 may receive vehicle data-bus information, such as vehicle status data or vehicle configuration data, from vehicle data bus transceiver 306.

Figure 4:
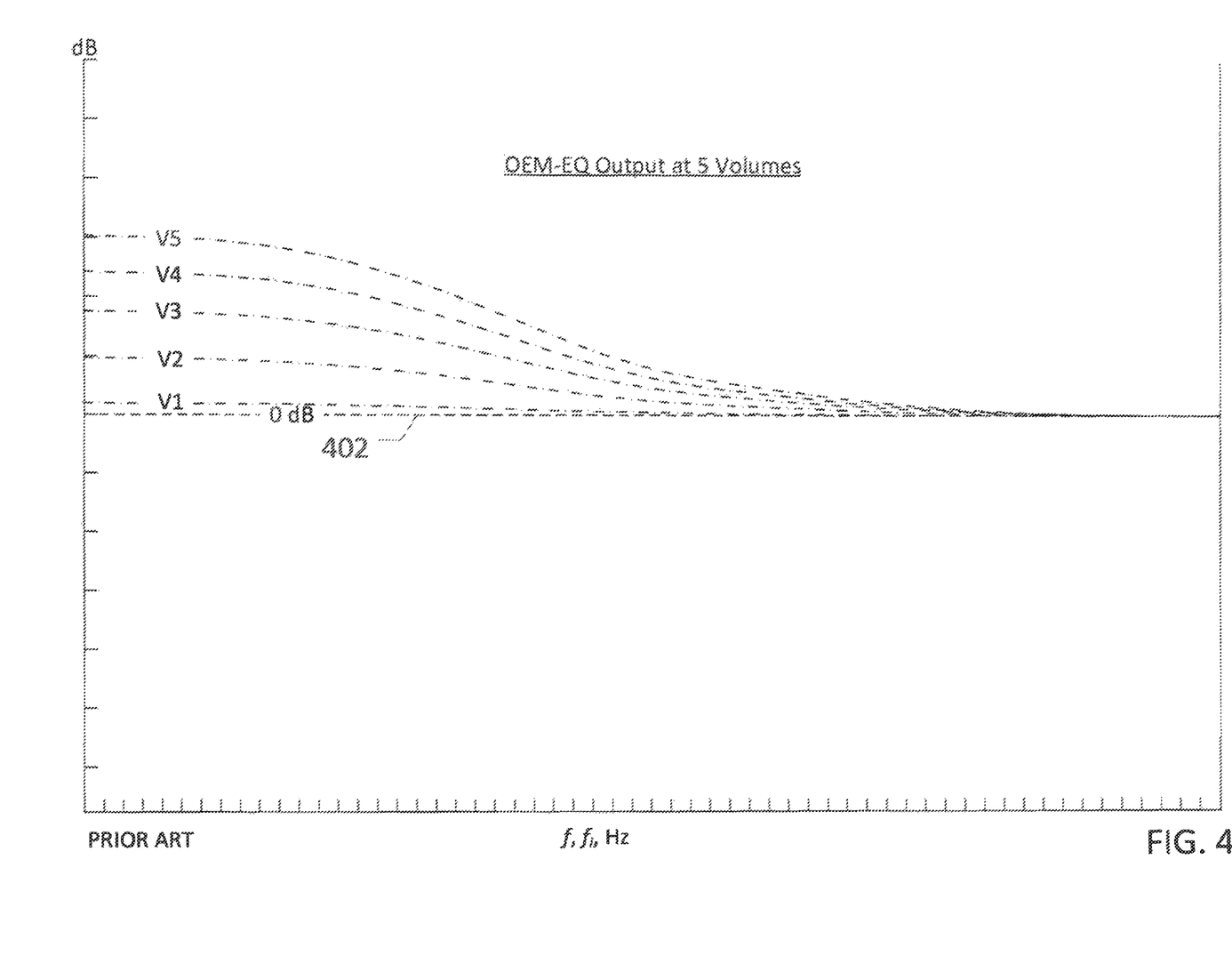
FIG. 4 shows schematically illustrative prior art information.

FIG. 4 shows illustrative OEM-EQ Audio weightings for different volume settings (V1 ... V5) and different frequencies $f_i$.

OEM EQ 203 (shown in FIG. 2) may apply the weightings to flat component 402 from digital audio file 206 (shown in FIG. 2). The weightings may be such as those that may be measured from the output of the OEM head unit, for example, for frequencies $f_i$, and at different volumes V1<V2<V3<V4<V5.

Figure 5:
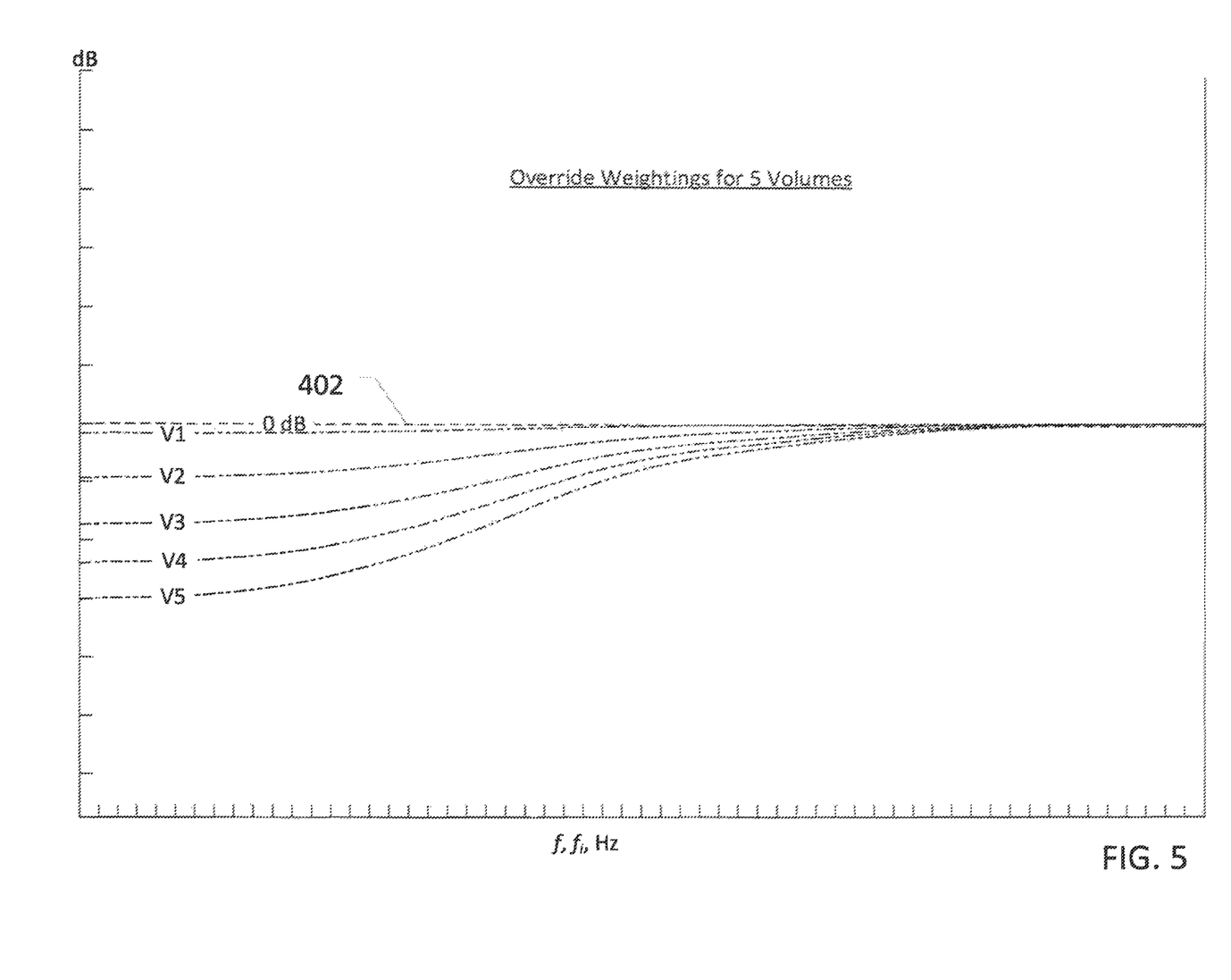
FIG. 5 shows schematically illustrative information produced in connection with apparatus and methods in accordance with principles of the invention.

FIG. 5 shows for each of volumes V1-V5 illustrative weightings of restorative components to nullify or reduce the OEM EQ weightings.

Figure 6:
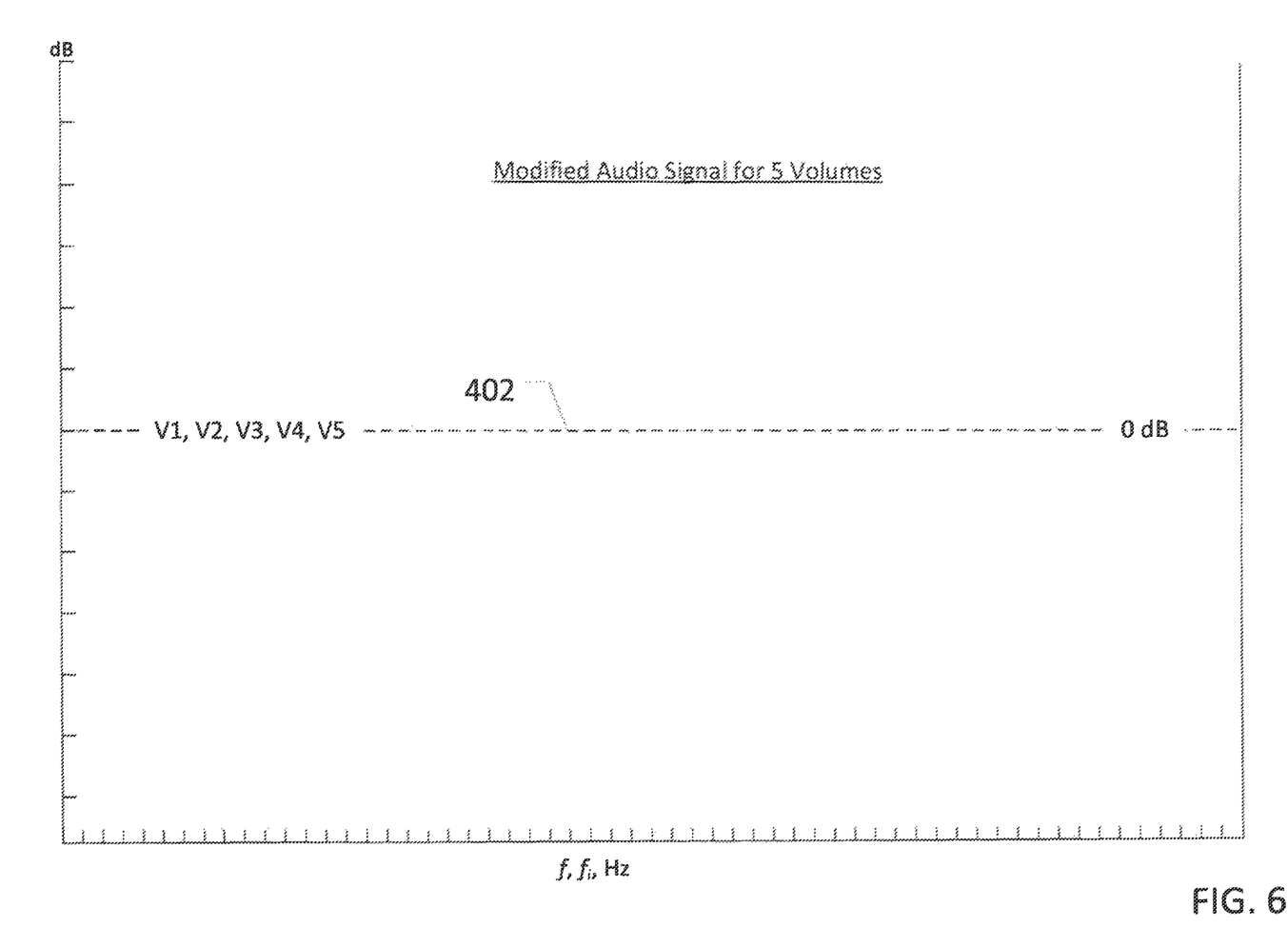
FIG. 6 shows schematically illustrative performance information of apparatus and methods in accordance with principles of the invention.

FIG. 6 shows illustrative flat component 402, the same for all of volumes V1-V5, of modified audio signal 220 (shown in FIG. 2).

Figure 7:
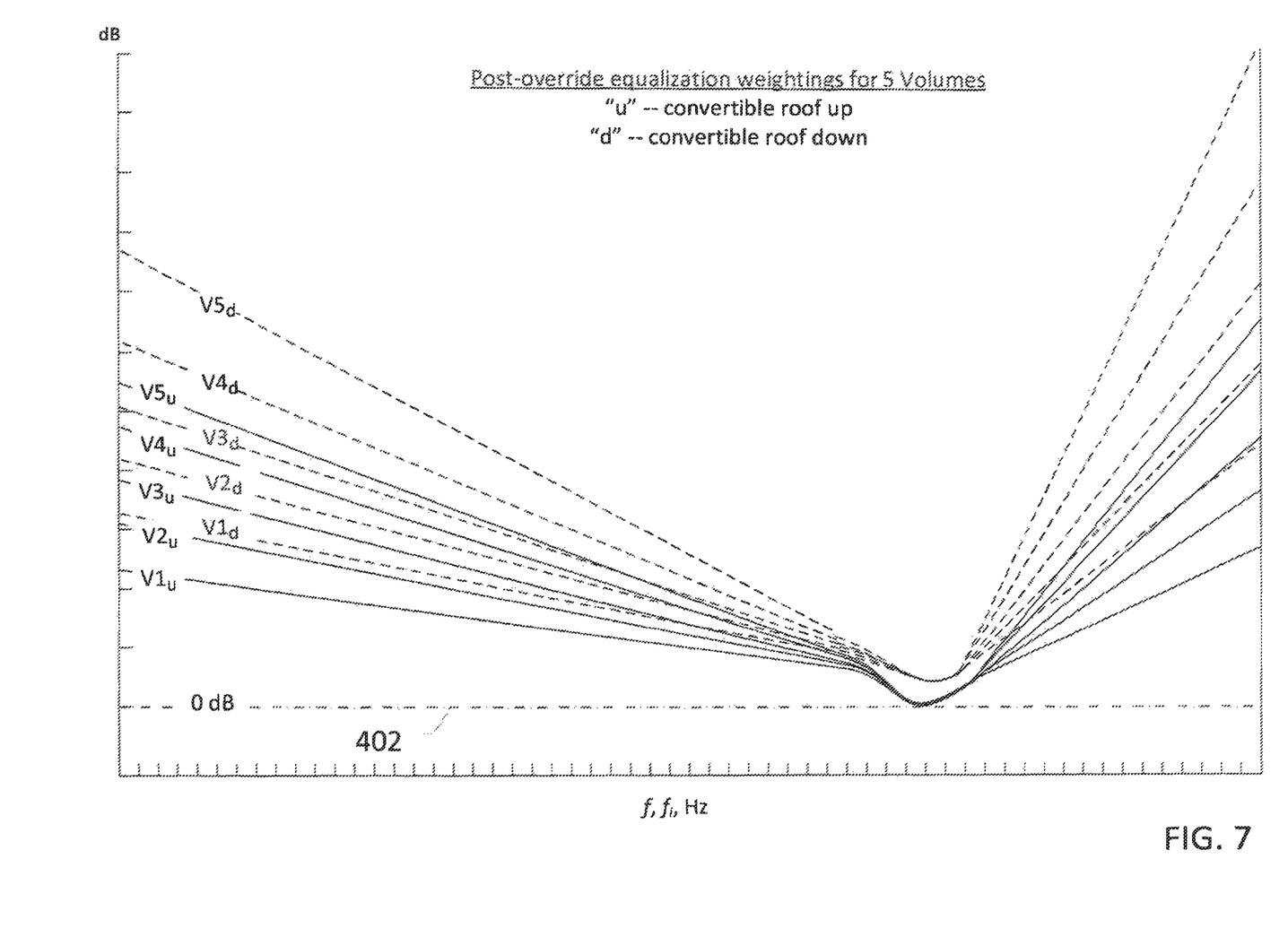
FIG. 7 shows schematically illustrative performance information of apparatus and methods in accordance with principles of the invention.

FIG. 7 shows schematically two illustrative families of weightings, each corresponding to an equalization component applied by OEM EQ override device 218 (shown in FIG. 2) after nullification of the OEM EQ compensation component.

The families produce modified audio signals 220 that offset the effects of different vehicle states, viz., convertible roof up ("U") and convertible roof down ("d"), both of which may be detected from vehicle status data. The weightings are different for different volumes V1-V5.

Figure 8:
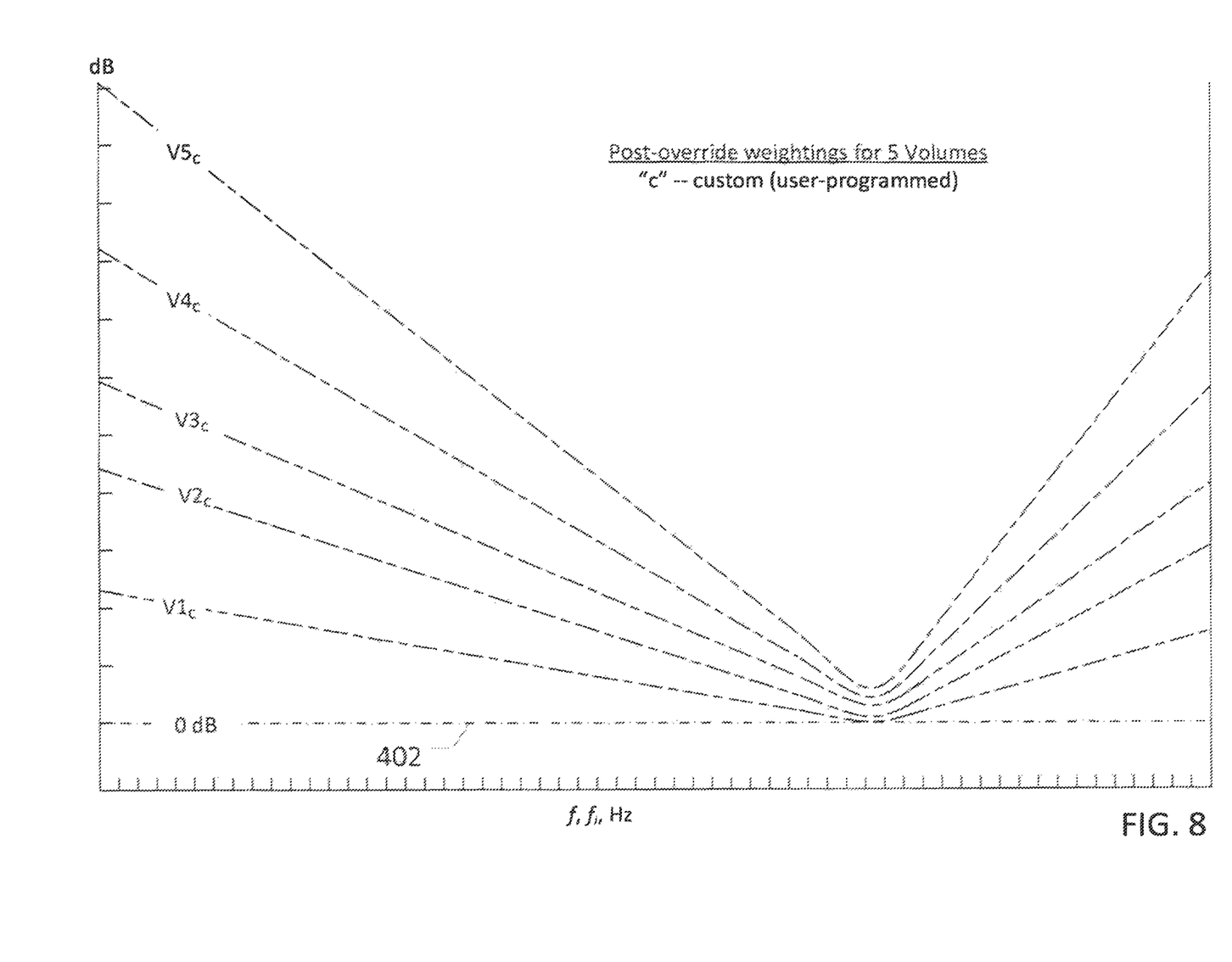
FIG. 8 shows schematically illustrative performance information of apparatus and methods in accordance with principles of the invention.

FIG. 8 shows schematically an illustrative family of weightings, each corresponding to an equalization component applied by OEM EQ override device 218 (shown in FIG. 2) after nullification of the OEM EQ compensation component.

The family represents custom acoustic responses that may be selected by a user, e.g., a driver or passenger. The custom responses are illustrated as being different for different volumes, but custom responses may be programmed to be volume-independent. The custom responses may be based on one or more of the parameters listed in Tables 1-3. The custom responses may be based on any other suitable user preferences or profiles. The custom response may be tuned using tie-points on a graphical equalizer interface.

Thus, apparatus and methods for providing an audio signal have been provided. Persons skilled in the art will appreciate that the present invention can be practiced by other than the described examples, which are presented for purposes of illustration rather than of limitation. The present invention is limited only by the claims that follow.

What is claimed is:

1. An apparatus for processing an audio signal, the apparatus comprising:
 a digital signal processor ("DSP") configured to receive an audio signal from a vehicular audio signal line, the audio signal including a flat component and a compensatory component, the compensatory component including an equalizer component applied by an equalizer;
 a microprocessor in electronic communication with the DSP; and
 machine-readable memory in electronic communication with the microprocessor;
 wherein the microprocessor is configured to:
  retrieve, from the memory, a restorative signal component; and
  apply, via the DSP, the restorative signal component to the audio signal to remove the compensatory component of the audio signal and acquire the flat component.

2. The apparatus of claim 1 wherein the restorative signal component corresponds to a vehicle state value.

3. The apparatus of claim 2 wherein the restorative signal component corresponds to one of a plurality of audio volume control settings.

4. The apparatus of claim 1 wherein the restorative signal component corresponds to a vehicle configuration parameter.

5. The apparatus of claim 4 wherein the restorative signal component further corresponds to a vehicle state value.

6. The apparatus of claim 5 wherein the vehicle state value is an audio volume control setting.

7. The apparatus of claim 4 wherein the vehicle configuration parameter corresponds to: a vehicle year; a vehicle make; and a vehicle model.

8. The apparatus of claim 1 wherein the microprocessor is further configured to instruct the DSP to add an equalization component to the audio signal after applying the restorative signal component to the audio signal.

9. The apparatus of claim 8 wherein the equalization component includes a vehicle state component.

10. The apparatus of claim 9 wherein the vehicle state component corresponds to one of a plurality of audio volume control settings.

11. The apparatus of claim 8 wherein the equalization component includes a vehicle configuration component.

12. The apparatus of claim 11 wherein the equalization component further corresponds to a vehicle state value.

13. The apparatus of claim 12 wherein the equalization component corresponds to one of a plurality of audio volume control settings.

14. A method for providing a sound signal, the method comprising:
   receiving an electrical audio signal having a flat component and a compensatory component, the compensatory component including an equalizer component applied by an equalizer;
   retrieving, from a memory of a microprocessor, a restorative signal component; and
   applying the restorative signal component to the audio signal to remove the compensatory component of the audio signal and acquire the flat component.

15. The method of claim 14 wherein the retrieving the restorative signal component comprises:
   selecting from machine readable memory a restorative function corresponding to a vehicle state value on a data bus.

16. The method of claim 15 wherein the vehicle state value corresponds to one of a plurality of audio volume control settings.

17. The method of claim 14 wherein the retrieving the restorative signal component comprises: selecting from machine readable memory a restorative function corresponding to a vehicle configuration parameter.

18. The method of claim 17 wherein the restorative function further corresponds to a vehicle state value.

19. The method of claim 18 wherein the vehicle state value corresponds to one of a plurality of audio volume control settings.

20. The method of claim 17 wherein the vehicle configuration parameter corresponds to: a vehicle year; a vehicle make; and a vehicle model.

21. The method of claim 17 wherein the selecting includes receiving the vehicle configuration parameter from a vehicle data bus.

22. The method of claim 14 further comprising adding an equalization component to the audio signal after applying the restorative signal component to the audio signal.

23. The method of claim 22 wherein the equalization component includes an active noise cancellation component.

24. The method of claim 22 wherein the equalization component includes a vehicle state component.

25. The method of claim 24 wherein the vehicle state component corresponds to one of a plurality of audio volume control settings.

* * * * *